United States Patent
Hamamoto et al.

(12) United States Patent (10) Patent No.: US 6,495,840 B2
(45) Date of Patent: Dec. 17, 2002

(54) ION-IMPLANTING METHOD AND ION-IMPLANTING APPARATUS

(75) Inventors: Nariaki Hamamoto, Kyoto (JP); Takao Matsumoto, Kyoto (JP)

(73) Assignee: Nissin Electric Co., Ltd., Kyoto (JP)

( * ) Notice: Subject to any disclaimer, the term of this patent is extended or adjusted under 35 U.S.C. 154(b) by 0 days.

(21) Appl. No.: 09/748,241

(22) Filed: Dec. 27, 2000

(65) Prior Publication Data

US 2001/0027015 A1 Oct. 4, 2001

(30) Foreign Application Priority Data

Dec. 28, 1999 (JP) ............................................ 11-372549

(51) Int. Cl.$^7$ ................................................. G21K 5/10
(52) U.S. Cl. ................................................. 250/492.21
(58) Field of Search .................... 438/14; 250/492.21, 250/492.22

(56) References Cited

U.S. PATENT DOCUMENTS 5,003,183 A * 3/1991 Nogami .................... 250/492.2

FOREIGN PATENT DOCUMENTS

| EP | 0398270 A2 | 5/1990 |
| JP | 8-115701 | 5/1996 |
| JP | 9-55179 | 2/1997 |

OTHER PUBLICATIONS

R.T. Sanders, P. Cameron, R. Damm, A. Donbar, M. Goldman, D. Kasha, A. McNerney, M. Meth, A. Ratti, R. Sprtz. "Test of the AGS Booster Low Frequency RF System". 1993 iEEE. pp. 1166 through 1168.*
Search Report from U.K. Patent Office.

* cited by examiner

Primary Examiner—John F. Niebling
Assistant Examiner—Andre C. Stevenson
(74) Attorney, Agent, or Firm—Finnegan, Henderson, Farabow, Garrett & Dunner LLP (57) ABSTRACT

The ion-implanting apparatus includes an implanting control device 26a having the functions of sweeping an ion beam by a sweeping magnet 12 and scanning a target by a scan mechanism. The implanting control device 26a has the functions of changing a sweep frequency of the ion beam to be swept by said sweeping magnet according to at least one of the species and energy of the ion beam and changing the minimum number of times of scanning of the target to be scanned by said scan mechanism according to the changing of the sweep frequency.

2 Claims, 6 Drawing Sheets

ION-IMPLANTING METHOD AND ION-IMPLANTING APPARATUS

BACKGROUND OF THE INVENTION

1. Field of the Invention

This invention relates to a hybrid scanning type of ion-implanting apparatus and ion-implanting method which magnetically sweep an ion beam and mechanically scan a target, and more particularly to means capable of sweeping an ion beam in a wide variety of energies and ion species and shortening an ion-implanting time to improve the throughput of the device. In this specification, the magnetic reciprocative scanning of the ion beam is referred to as "sweep or sweeping", and the mechanical reciprocative scanning of the target is referred to "scan or scanning".

2. Description of the Related Art

Ion implantation, it is important to implant ions into a target (e.g. wafer) with good uniformity. This is particularly important when the ion implantation is adopted in a semiconductor manufacturing process. As the case may be, it is desired to irradiate the target with the ion beam scanned in parallel.

Figure 2:
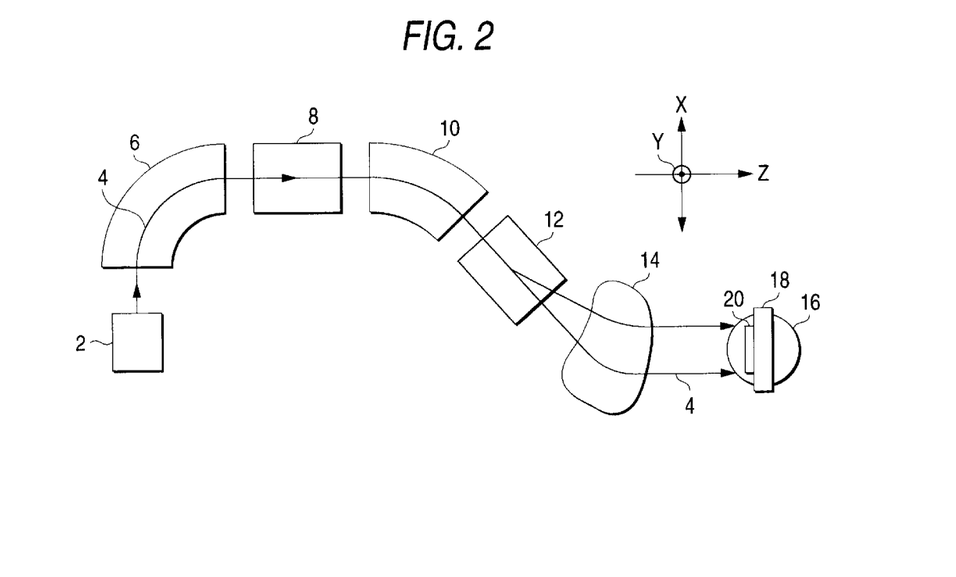
FIG. 2 is a schematic plan view showing an example of a conventional ion-implanting apparatus.

A conventional art of the ion-implanting apparatus proposed to fulfill the above-mentioned demand is shown in FIG. 2. This apparatus basically has the same structure as described in Japanese Patent Unexamined Publication No. Hei. 8-115701(JP-A-8-115701).

The ion-implanting apparatus includes an ion source 2 for drawing an ion beam 4, a mass separation magnet 6 for selecting a specific ion species drawn therefrom, an accelerator tube 8 for accelerating or decelerating the ion beam derived therefrom, a mass separation magnet 10 (also referred to as "energy separation magnet") for selecting the ion species with a specific energy from the ion beams 4 derived therefrom, a sweeping magnet 12 for sweeping the ion beam derived therefrom in an X-direction(for example, horizontal direction) under a magnetic field, and paralleling magnet 14 for bending the ion beam 4 derived therefrom again to scan the ion beam 4 in parallel in cooperation with the sweeping magnet, i.e. making the ion beam 4 in parallel to a Z-axis which is a movement direction of the ion beam 4. The ion species is defined by the mass number and the valence of the ion.

Figure 3:
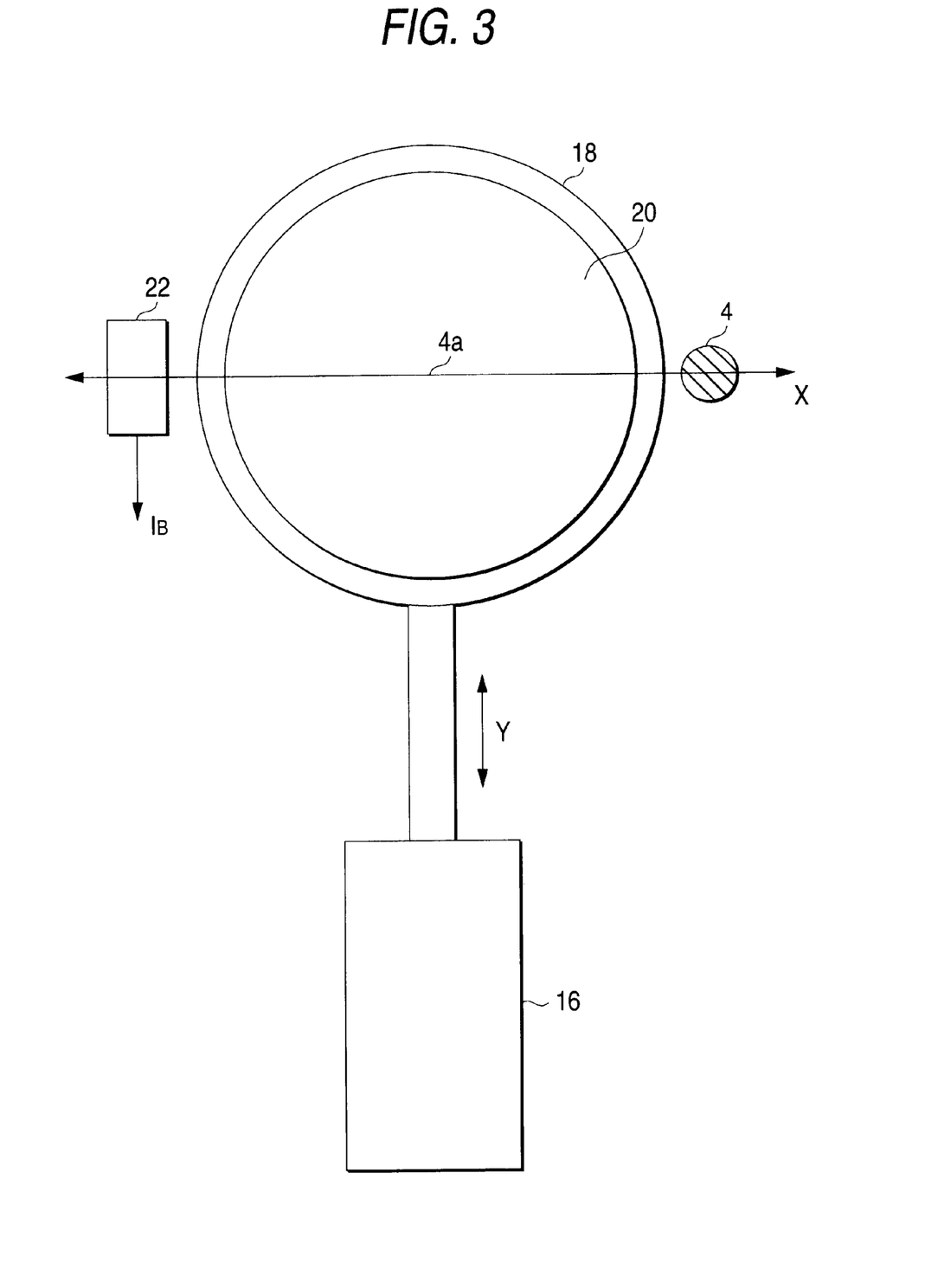
FIG. 3 is a front view showing the vicinity of a target in FIG. 2 and its scan mechanism.

The ion beam 4 derived from the paralleling magnet 14 is applied to a target (e.g. wafer) 20 held in a holder 8 of a scan mechanism 16. Referring to FIG. 3, the scan mechanism 16 mechanically scans the target 20 within a sweep region 4a of the ion beam 4 in a Y-direction (e.g. vertical direction) perpendicular to the above X direction. Due to a cooperation between the scanning of the target 20 and the sweep of the ion beam 4, the ion can be implanted into the entire surface of the target 20 with good uniformity.

Figure 4:
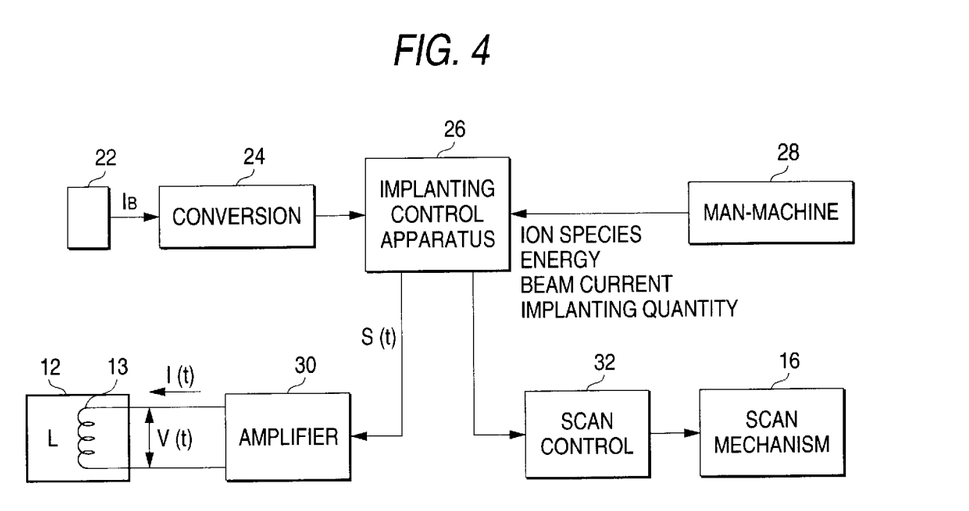
FIG. 4 is a block diagram showing an example of a control circuit for the ion-implanting apparatus shown in FIG. 2.

The ion-implantation in this ion-implanting apparatus can be controlled by a control circuit including an implanting control device 26 as shown in FIG. 4.

The desired ion species, beam energy, beam current (beam quantity) and implanting quantity are set by a man-machine interface 28 and supplied to an implanting control device 26.

The implanting control device 26 calculates the number of times of scanning of the target 20 for realizing the aimed implanting quantity by the aimed beam current on the basis of these items of set information, and controls the scan mechanism 16 through a scan control unit 32 to realize it. The scan mechanism 16 converts a control signal supplied from the scan control device 26 into a signal for driving a motor in the scan mechanism 16.

The initial value of the scan speed of the target 20 is constant, and made variable during implantation by the implanting control device 26 according to a change in the beam current of the ion beam 4 which is implanted. Specifically, as the beam current decreases, the scan speed is decreased. Inversely, as the beam current increases, the scan speed is increased. In order to implement this, the beam current $I_B$ of the ion beam which is being implanted is measured all the time by a dose Faraday 22 (see FIG. 3 also) arranged on the side of the upstream of the target 20. The measured beam current $I_B$ is supplied to the implanting control device 26 via a current converter 24.

The sweep current I(t) which drives the sweeping magnet 12 results from the shaping of a triangular wave. This waveform shaping is carried out by the implanting control device 26 through a known method described in Japanese Patent Unexamined Publication No. Hei. 9-55179(JP-A-9-55179). For example, using a multi-point beam monitor not shown arranged upstream and downstream side of the target 20, the beam current density distribution in the X direction on the target 20 is estimated, and the triangular wave is shaped so that the distribution approaches constant. Concretely, the triangular wave is shaped so that the sweep speed of the ion beam 4 is decreased at the position where the current density in the current density distribution is desired to be increased whereas the sweep speed is increased at the position where the current density is desired to be decreased, thereby forming a sweep signal S(t). The sweep signal is amplified by a driving amplifier 30 and is supplied to the sweeping magnet 12 as a sweep current I(t).

In the prior art ion-implanting apparatus, the sweep frequency of the ion beam 4 is fixed. The minimum number of times of scanning of the target 20 is also fixed in order to assure the constant uniformity of implanting.

Figure 5:
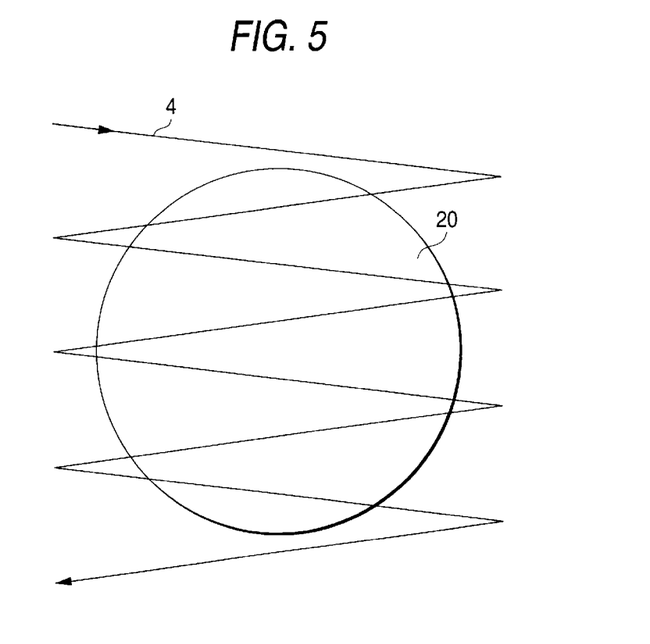
FIG. 5 is a view showing a locus of the ion beam for a target.

More specifically, generally, assuming that the scan speed in the Y direction of the target 20 is fixed, the implanting uniformity for the target 20 is improved as the sweep frequency of the ion beam 4 becomes high. Namely, as described above, the scan speed of the target 20 is fixed when the beam current of the ion beam 4 is fixed. Therefore, when viewed from the target 20, as shown in FIG. 5, the ion beam is implanted while it draws the locus in zigzag. Therefore, it can be easily supposed that when the sweep frequency of the ion beam 4 becomes low, the area which was not implanted by scanning the target only once is produced.

In an actual implantation, as the case may be, drawing of the ion beam 4 stops momentarily because of discharging in a beam drawing portion (drawing electrode system) of an ion source 2. At this time, the change in the beam current $I_B$ of the ion beam 4 is measured by the dose Faraday 22 described above, and a command of stopping the scanning of the target 20 is issued from the implanting control device 26. This intends to prevent the area of the target not implanted from being generated. However, the change in the beam current $I_B$ is detected later than the real change by a delay time $t_o$ (see FIG. 6) of one period at the maximum in the sweep of the ion beam 4. The reason is as follows. When the beam current $I_B$ changes at the instant the ion beam 4 passes the dose Faraday 22, this change cannot be measured by the dose Faraday 22 until the ion beam returns to the dose Faraday 22 again. This also applies to the detection at the time of recovery of the ion beam.

Figure 6:
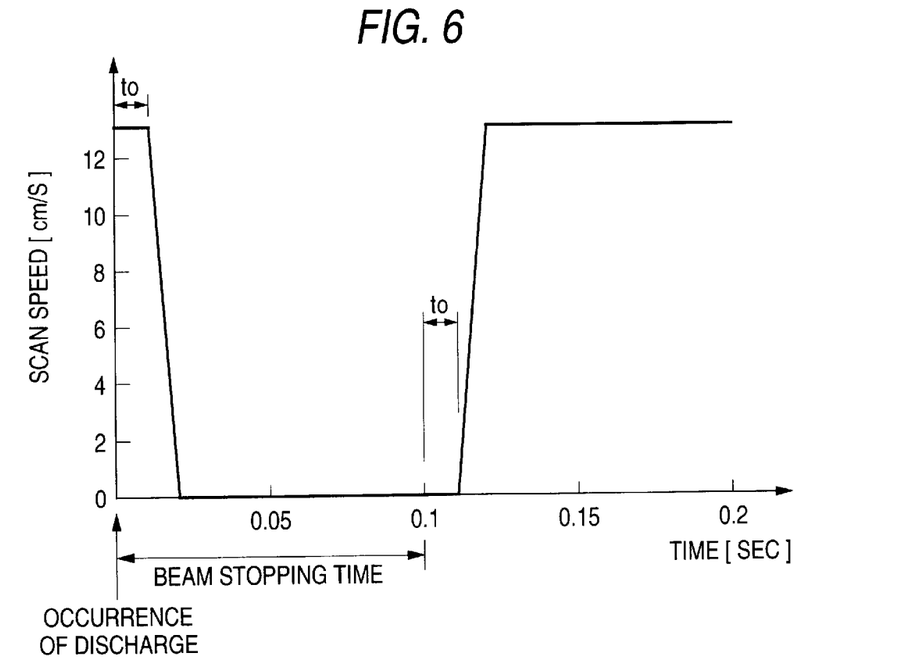
FIG. 6 is a view showing a change in the scan speed of the target when discharge occurs in an ion source.

In addition, since the scan mechanism 16 has inertia, the scanning of the target 20 cannot be stopped within a zero time. At the time of the recovery of the ion beam 4, the scan speed cannot also be increased to a rated speed within a zero time. An example of the change in the scan speed of the target 20 during that time is shown in FIG. 6. In this example, the stopping time of the ion beam 4 is set for 0.1 sec.

Figure 7:
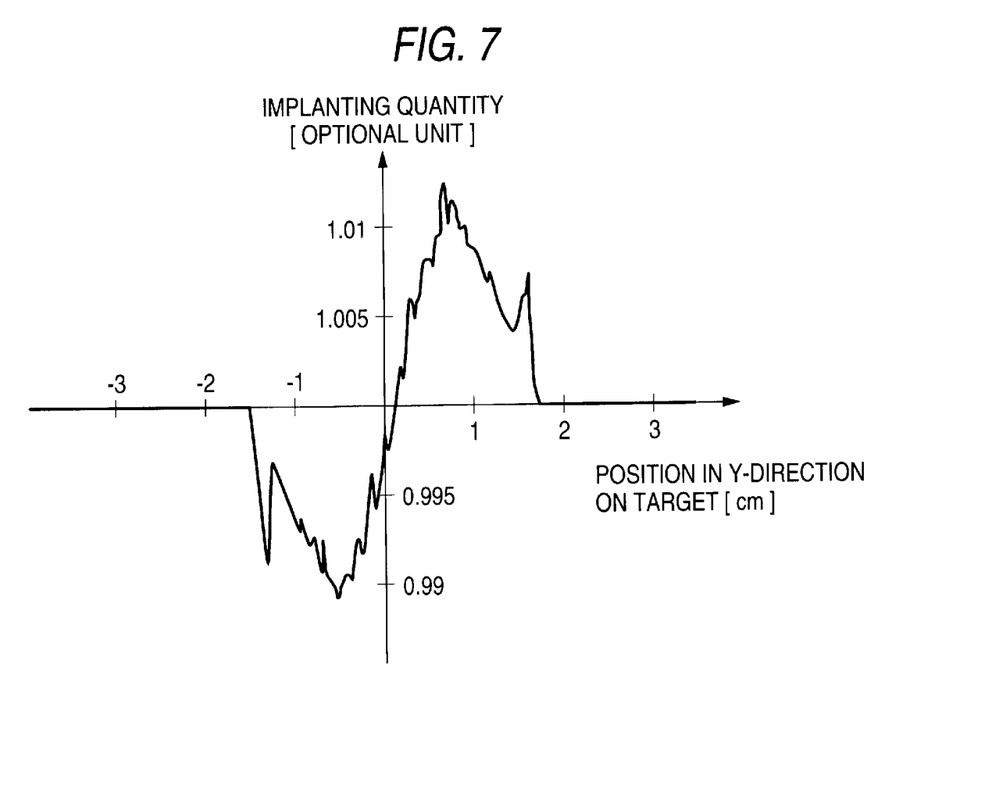
FIG. 7 is a graph showing the non-uniformity of implantation in a Y-direction on the target when discharging occurs in the ion source.

For the above reason, when the drawing of the ion beam 4 is stopped for an instant, the non-uniformity of ion implantation in the Y-direction on the target occurs. An example of the distribution of the quantity of the implanted ion when the phenomenon shown in FIG. 6 occurs is shown in FIG. 7. It shows the example where the target 20 is scanned once, and discharge has occurred once when the ion beam 4 stands at the center of the target 20 in the Y-direction. In this example, the uniformity of implantation is lowered (deteriorated) to 1.156%.

Incidentally, it should be noted that the uniformity of implantation is represented by $(\sigma/M) \times 100[\%]$ where the average value of the distribution of the quantity of the implanted ion is M and the standard deviation $\sigma$, and that of 0% is the best.

The uniformity of implantation is deteriorated as the sweep frequency of the ion beam 4 becomes low. This is because the above delay time $t_o$ is prolonged correspondingly. The phenomenon of deterioration of the uniformity of implantation occurs likewise when the beam current $I_B$ of the ion beam 4 drawn from the ion source 2 varies.

In order to obviate such failure, the conventional ion-implanting apparatus flattens the dense/coarse portion of the above distribution of the implanting quantity by increasing the number of times of scanning of the target 20, thereby assuring prescribed uniformity of implantation. Namely, since the sweep frequency of the ion beam 4 is fixed, the conventional ion implantation apparatus is required to assure a constant minimum number of time of scan necessary to compensate for the above dense/coarse portion of the implanting quantity.

Therefore, although the beam current $I_B$ is sufficient when viewed from the ion source 2, the implantation time cannot be shortened since the minimum number of times of scan must be assured. In other words, the throughput of the apparatus cannot be improved.

When the sweep frequency of the ion beam 4 is increased, it cannot be increased excessively. The sweep frequency has a upper limit. This will be explained referring to FIG. 4. The sweep signal S(t) supplied from the implanting control device 26 is amplified by a driving amplifier 30 to provide a sweep current I(t) necessary to drive the sweeping magnet 12.

In such a configuration, the sweep frequency of the ion beam 4 is determined by the following factors.

(1) Magnitude of the sweep current I(t)

It depends on the ion species and energy of the ion beam 4. It also limited by the maximum output current of the driving amplifier 30.

(2) Magnitude of the output voltage V(t) from the driving amplifier 30

It is limited by the maximum output voltage from the driving amplifier 30.

(3) Inductance L of the coil 13 of the sweeping magnet 12

It is determined by the necessary magnetic flux density of the sweeping magnet 12.

Now, assuming that the sweep current when the ion species having a certain mass with certain energy is swept in a desired width by the sweeping magnet 12 is I(t), the output voltage at this time from the driving amplifier 30 is V(t), and the inductance of the coil 13 of the sweeping magnet 12 is L, with the resistance of the coil being negligible, the relationship among these items can be expressed by $$V(t) = L \cdot dI(t)/dt \qquad [1]$$

Figure 8A:
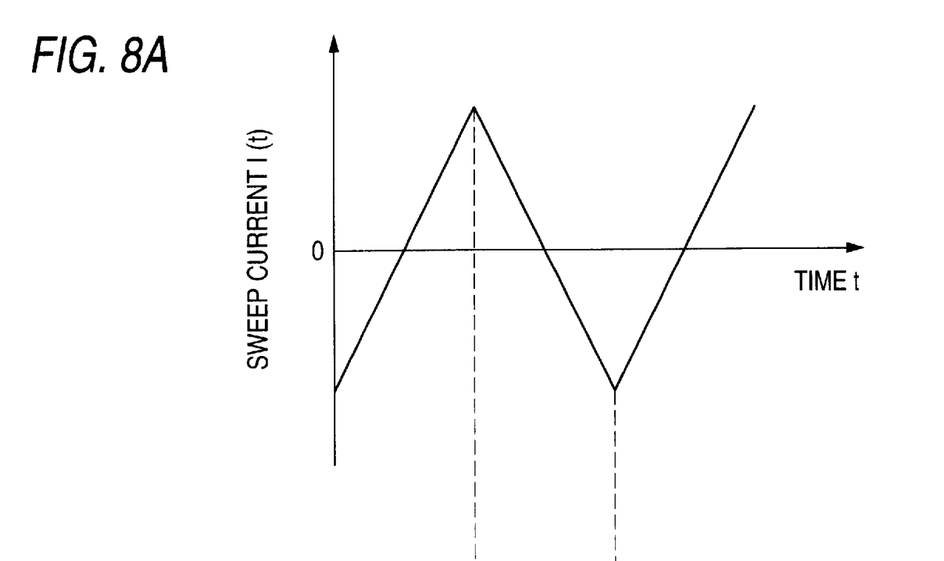
FIG. 8A is a view showing the waveform (A) when the sweep current is a triangular wave and FIG. 8B is a view showing an example of the output voltage (B) of the driving amplifier.
Figure 8B:
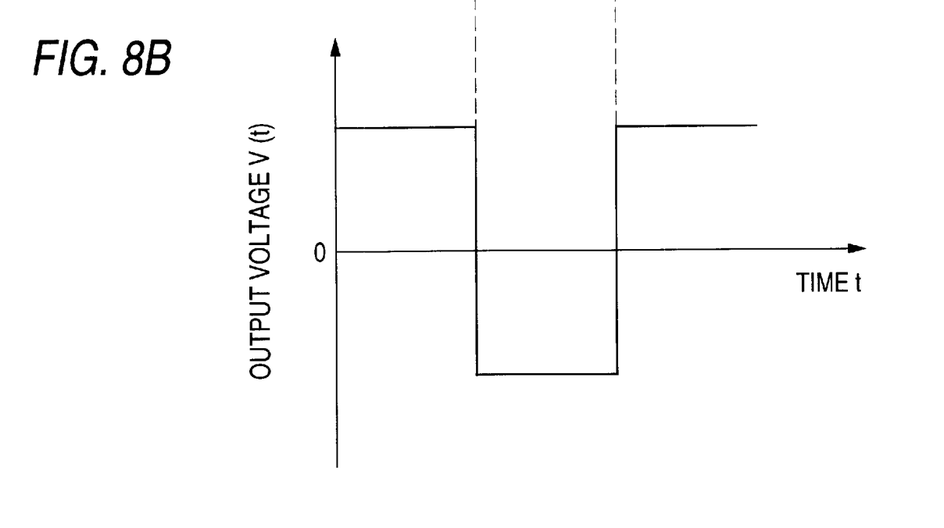
Figure 9A:
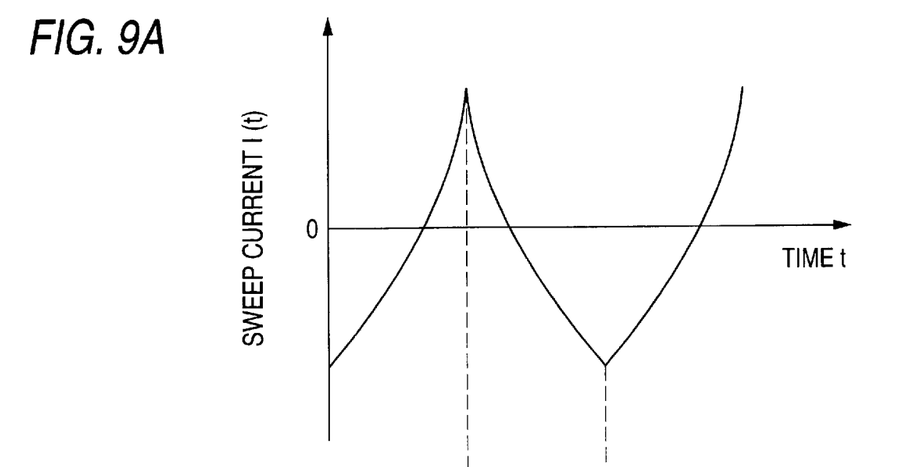
FIG. 9A is a view showing the waveform (A) when the sweep current is shaped in the waveform and FIG. 9B is a view showing an example of the output voltage (B) of the driving amplifier.
Figure 9B:
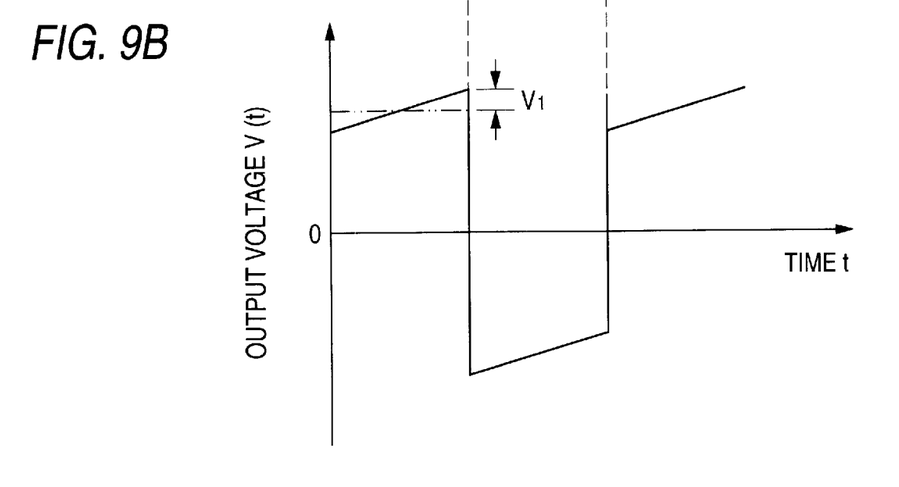

An example of the relationship of the sweep current I(t) which is a triangular wave with the output voltage V(t) is shown in FIG. 8. The output voltage V(t) has a square waveform. If the sweep frequency of the ion beam 4, i.e. the frequency of the sweep current I(t) is increased twice for example, since the inductance L is a value intrinsic value to the sweeping magnet 12 the necessary output voltage V(t) is also increased twice as seen from Equation [1]. Further, when the sweep current I(t) is wave-shaped as described above in order to enhance the uniformity of implantation in the X-direction on the target, as understood from the example shown in FIGS. 9A and 9B, the output voltage V(t) which is larger (that corresponds to $V_1$ in FIG. 9B) than that in the case of the triangular wave is required. This is because the voltage must be increased during the same period to increase dV(t)/dt. However, if this required V(t) exceeds the maximum output voltage of the driving amplifier 30, the rise in the sweep current I(t) slows down so that the uniformity of implantation in the X-direction is deteriorated.

On the other hand, the ion beam 4 having a lower energy and lighter ion species requires a smaller beam current I(t). This is because such an ion beam can be easily bent.

For the reason described above, in an actual apparatus, the upper limit of the sweep frequency of the ion beam 4 is limited by the energy of the ion beam 4, ion species and the maximum output voltage of the driving amplifier 30. Oppositely speaking, in the conventional ion implantation device, the sweep frequency of the ion beam 4 is fixed so that the energy of the ion beam 4 which can be swept properly and the ion species are limited.

Thus, for example, in order to deal with the ion beam 4 with higher energy, it is necessary to improve the specification such as boosting the maximum output voltage of the driving amplifier 30 or decreasing the inductance L of the coil 13 of the sweeping magnet 12. This requires serious cost and labor. This also applies to dealing with the heavier ion species.

Further, when the sweep frequency of the ion beam 4 is simply reduced in order to deal with the higher energy or heavier ion species, for the reason described above, if the minimum number of times of scanning of the target is not increased, the uniformity of implantation for the target 20 is deteriorated. However, if the minimum number of times of scan is increased, the time of implantation is lengthened so that the throughput of the device is deteriorated.

SUMMARY OF THE INVENTION

In view of the circumstance described, the main object of this invention is to provide an ion-implantation method and apparatus which can sweep the ion beam with a wide variety of energies and ion species without changing devices for sweeping the ion beam and shorten the implanting time to improve the throughput of the apparatus.

The ion-implanting method according to this invention comprising a step of changing a sweep frequency of the ion beam to be swept by said sweeping magnet according to at least one of the species and energy of the ion beam and changing the minimum number of times of scanning of the target to be scanned by said scan mechanism according to the changing of the sweep frequency.

The ion-implanting apparatus according to this invention comprises an implanting control device which serves to control sweeping an ion beam by a sweeping magnet and scanning a target by a scan mechanism, and has the functions of changing a sweep frequency of the ion beam to be swept by said sweeping magnet according to at least one of the species and energy of the ion beam and changing the minimum number of times of scanning of the target to be scanned by said scan mechanism according to the changing of the sweep frequency.

Since the sweep frequency of the ion beam is changed according to at least one of the ion species and energy of the ion beam to be swept, dI(t)/dt indicated in the Equation [1] can be varied. Therefore, even if at least one of the ion species and energy of the ion beam is changed, the ion beam can be swept normally within the capability of the devices relative to sweeping of the ion beam. Thus, without changing the devices relative to sweeping of the ion beam, the ion beam with a wide variety of energies and ion species can be swept normally.

Further, the ion beam to be swept having a lower energy and energy and lighter ion species can be more easily bent by the sweeping magnet. Therefore, the sweep current therefor may be reduced and the sweep frequency can be increased correspondingly. Thus, by increasing the sweep frequency, the minimum number of times of scanning of the target can be reduced to assure prescribed uniformity of implantation. Correspondingly, the implanting time can be shortened to improve the throughput of the apparatus.

DETAILED DESCRIPTION OF THE PREFERED EMBODIMENT

Figure 1:
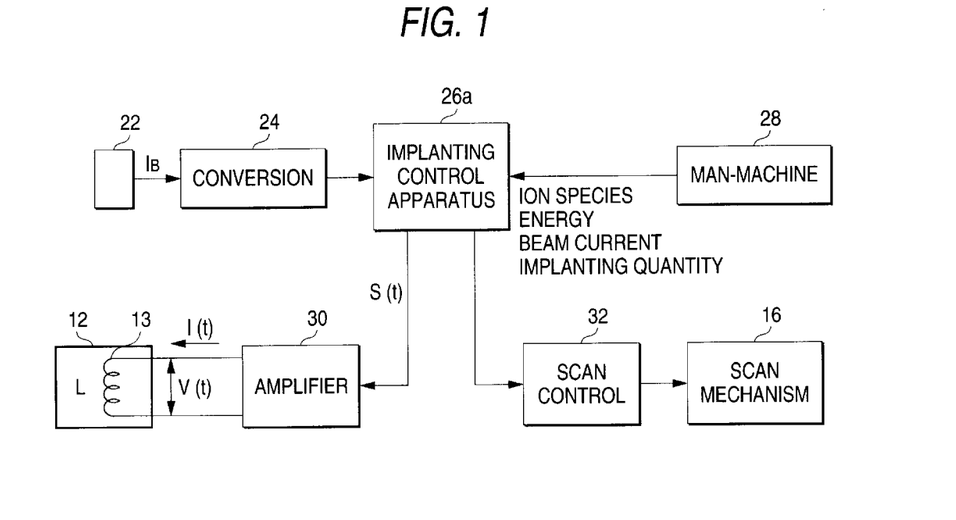
FIG. 1 is a block diagram showing an example of a control circuit for an ion-implanting apparatus according to this invention.

FIG. 1 is a block diagram showing an example of the control circuit for an ion-implanting device according to this invention. The entire configuration of the ion-implanting device, which is the same as those shown in FIGS. 2 and 3, will refer to the figures and the above-mentioned explanations to omit repeated explanations. Further, in the following explanation, like reference numerals and signs refer to like parts in the prior art described above. The differences of this invention from the conventional art will be mainly explained.

The ion-implanting device according to this invention is provided with an implanting control device 26a which corresponds to the conventional implanting control device 26. The implanting control device 26a has the functions of controlling the sweep of the ion beam 4 by the sweeping magnet 12 and the scanning of the target 20 by the scan mechanism 16. Concretely, as described previously, the implanting control device 26a supplied the sweep signal S(t) which leads to the sweep current I(t) to the driving amplifier 30. Further, it controls the scan mechanism 16 through the scan control unit 32 to control the scan speed and number of times of scanning of the target 20.

In addition to the functions described above, the implanting control device 26 also has the functions of changing a sweep frequency of the ion beam 4 to be swept by said sweeping magnet 12 according to at least one of the species and energy of the ion beam and of changing the minimum number of times of scanning of the target 20 to be scanned by said scan mechanism 16 according to the changing of the sweep frequency. In this example also, as described above, the ion species, energy, etc. of the ion beam 4 to be swept are also set through the man-machine-interface 28. Concretely, the changing of the sweep frequency of the ion beam 4 by the sweeping magnet 12 is carried out by changing the sweep frequency of the sweep signal S(t) supplied to the driving amplifier 30.

As described above, the conventional ion-implanting device, the sweep frequency of the ion beam 4 and the minimum number of times of scanning of the target 20 are fixed. Therefore, as long as the beam current of the ion beam 4 and the implanting quantity for the target are fixed, even if the ion species and energy of the ion beam are varied, the number of times of scanning of the target 20 is basically identical. The number of times of scan is also identical. Therefore, even if it is intended that the beam current is increased to shorten the implanting time, as the case may be, it cannot be increased to reduce the fixed minimum number of times of scan. Generally, in order to improve the throughput of the apparatus, the beam current is set so that the aimed quantity can be implanted in the minimum number of times of scan. Therefore, the value of the minimum number of times of scan is desired as low as possible.

On the other hand, in the ion-implanting apparatus according to this invention, the implanting control device 26a changes a sweep frequency of the ion beam 4 to be swept by said sweeping magnet according to at least one of the species and energy of the ion beam and changes the minimum number of times of scanning of the target 20 to be scanned by said scan mechanism 16 according to the changing of the sweep frequency, thereafter, drives(perform the ion implantation).

An explanation will be given of a variation in the uniformity of implantation when the sweep frequency of the ion beam 4 has been changed in accordance with the ion species or energy of the ion beam. The variation in the uniformity of implantation will be examined for the case where the discharging in the ion source 2 occurs once during the implantation under, for example, the following condition and the ion beam 4 stops for 0.1 sec.

Sweep frequency: 100 Hz

Scan speed: 20 cm/s

Implanting quantity: $5.0 \times 10^{12}/cm^2$

Beam current: 150 μA (this is due to the limitation by the minimum number of times of scan)

Number of times : 4 times (minimum number of times of scan)

Implanting time: 10 sec.

The calculated value of the uniformity of implantation under the above condition is 0.248%. If the lowest satisfactory value of the uniformity is 0.25%, the 0.248% is at the very limit. Assuming that the uniformity of implantation when the discharge occurs once during single scan is A %, the uniformity of implantation is improved more greatly as the number of times of scan is increased. For example, the uniformity of implantation when the discharge occurs only once during n times of scan (n: number of times of scan) is represented by A/n %. Therefore, in the above example, if the number of times of scan is set for 3 times, the uniformity of implantation is 0.33% which results in failure. For this reason, the minimum number of times of scan is set for 4 times.

Now, under the above condition, when the sweep frequency of the ion beam 4 is changed from 100 Hz (mode 1) into 200 Hz (mode 2) or 300 Hz (mode 3), as seen from Table 1, the uniformity of implantation is gradually improved.

TABLE 1

|  | mode 1 | mode 2 | mode 3 |
|---|---|---|---|
| Sweep Frequency (Hz) | 100 | 200 | 300 |
| Scan Speed (cm/s) | 20 | 20 | 20 |
| Implanting quantity (pieces/cm2) | $5 \times 10^{12}$ | $5 \times 10^{12}$ | $5 \times 10^{12}$ |
| Beam Current ($\mu$A) | 150 | 150 | 150 |
| Number of Times of Scan (times) | 4 | 4 | 4 |
| Implanting Time (s) | 10 | 10 | 10 |
| Uniformity of Implantation | 0.248 | 0.13 | 0.099 |

As seen from the Table 1, if the sweep frequency of the ion beam 4 is increased, the number of times of scan can be reduced while the uniformity of implantation is kept within a prescribed successful range. Therefore, the beam current of the ion beam 4 can be increased. An example thereof is indicated in Table 2.

TABLE 2

|  | mode 1 | mode 2a | mode 3a |
|---|---|---|---|
| Sweep Frequency (Hz) | 100 | 200 | 300 |
| Scan Speed (cm/s) | 20 | 20 | 20 |
| Implanting quantity (pieces/cm2) | $5 \times 10^{12}$ | $5 \times 10^{12}$ | $5 \times 10^{12}$ |
| Beam Current ($\mu$A) | 150 | 200 | 300 |
| Number of Times of Scan (times) | 4 | 3 | 2 |
| Implanting Time (s) | 10 | 7.5 | 5 |
| Uniformity of Implantation | 0.248 | 0.17 | 0.199 |

In the conventional ion-implanting apparatus, since the sweep frequency of the ion beam 4 is fixed, only the mode 1 in Table could be selected. On the other hand, in the ion-implanting apparatus according to this invention, the mode 2 or mode 3 can be selected by changing the sweep frequency. As a result, the implanting time can be shortened to improve the throughput.

As described above, the sweep frequency of the ion beam 4 is limited by the energy and ion species of the ion beam 4 to be swept. Specifically, the ion beam to be swept having a lower energy and light ion species can be more easily bent by the sweeping magnet 12. Therefore, the sweep current I(t) therefor may be reduced. Correspondingly, dI/dt in the above Equation [1] is reduced so that the sweep frequency can be increased. In other words, under the implanting condition that the ion beam has a high energy and heavy (i.e. large mass number) ion species, the sweep frequency cannot be increased to exceed the limit. Therefore, the implanting time has no great difference from the case where the sweep frequency is fixed. However, under the implanting condition that the ion beam has a low energy and a light (i.e. small mass number) ion species, as described above, the sweep frequency can be increased to reduce the minimum number of times of scan. Thus, when various implanting conditions (recipes) are dealt with, as a whole, this invention can improve the throughput of the apparatus as compared with the case where the sweep frequency is fixed.

In addition, since the implanting condition can be dealt with by changing the sweep frequency, it is hardly necessary to change the specification such as boosting the maximum output voltage of the driving amplifier 30 or decreasing the inductance L of the coil 13. Namely, it is not necessary to change devices relative to sweeping of the ion beam. Thus, the ion beam with high energy and heavy ion species can be simply dealt with.

The following relationship stands between the sweep current I of the ion beam 4 and the upper limit F of the sweep frequency. Therefore, using this relationship, the sweep frequency can be easily calculated.

$$I\{\sqrt{(\text{mass of an ion}) \times (\text{energy})}\}/\text{valence of the ion}\} F \qquad [2]$$

As a practical example, with the parameter Table 3 as shown in Table 3 being stored in the ion-implanting control apparatus 26a, in order to deal with the ion species (concretely, mass number and valence of the ion) and energy which are set through the man-machine interface 28, it is possible to effect the changing of the sweep frequency of the ion beam 4 and changing the minimum number of scanning of the target 20 according to the parameters of the parameter Table.

TABLE 3

| Mass number of an ion x energy/ valence $^2$ (AMU · keV) | <5000 | 5000~ 10000 | >10000 |
|---|---|---|---|
| Sweep Frequency (Hz) | 300 | 200 | 100 |
| Scan Speed (cm/s) | 20 | 20 | 20 |
| Minimum Number of Times of Scan (times) | 2 | 3 | 4 |

The sweep frequency may be increased from 3 manners so that the parameter table of Table 3 may be further subdivided. In the case of dealing with the ion with higher energy, a parameter of the sweep frequency lower than 100 Hz has only to be added.

As understood from the description hitherto made, in accordance with this invention, since the sweep frequency of the ion beam is changed according to at least one of the ion species and energy of the ion beam to be swept, even if at least one of the ion species and energy of the ion beam is changed, the ion beam can be swept normally within the capability of the devices relative to sweeping of the ion beam. Therefore, without changing the devices relative to sweeping of the ion beam, the ion beam with a wide variety of energies and ion species can be swept normally.

Further, as the ion beam to be swept is lower in the energy and lighter in the ion species, it can be more easily bent by the sweeping magnet. Therefore, the sweep current therefor may be reduced. Correspondingly, the sweep frequency can be increased. Thus, the minimum number of times of scanning of the target can be reduced to assure prescribed uniformity of implantation. Correspondingly, the implanting time can be shortened to improve the throughput of the apparatus.

While the presently preferred embodiment of the present invention has been shown and described, it is to be understood that this disclosure is for the purpose of illustration and that various changes and modifications may be made without departing from the scope of the invention as set forth in the appended claims.

What is claimed is:

1. An ion-implanting apparatus comprising:

a sweeping magnet for sweeping an ion beam in an X-direction under a magnetic field;

a scan mechanism for mechanically scanning a target within a sweep region of the ion beam in a Y-direction perpendicular to said X-direction; and an implanting control unit which changes a sweep frequency of the ion beam to be swept by said sweeping magnet according to at least one of the ion species and energy of the ion beam and changes the minimum number of times of scanning of the target to be scanned by said scan mechanism according to the changing of the sweep frequency.

2. An ion-implanting method comprising:

sweeping an ion beam in an X-direction under a magnetic field by a sweeping magnet;

scanning mechanically a target within a sweep region of the ion beam in a Y-direction perpendicular to said X-direction by a scan mechanism; and changing a sweep frequency of the ion beam to be swept according to at least one of the ion species and energy of the ion beam and changing the minimum number of times of scanning of the target to be scanned according to the changing of the sweep frequency.

* * * * *